US012633888B2

(12) United States Patent　　　(10) Patent No.:　US 12,633,888 B2

Eksler　　　　　　　　　　　　　(45) Date of Patent:　　May 19, 2026

(54) METHOD AND DEVICE FOR LIMITING OF OUTPUT SYNTHESIS DISTORTION IN A SOUND CODEC

(71) Applicant: VOICEAGE CORPORATION, Town of Mount Royal (CA)

(72) Inventor: Vaclav Eksler, Brno (CZ)

(73) Assignee: VOICEAGE CORPORATION, Town Of Mount Royal (CA)

( * ) Notice: Subject to any disclaimer, the term of this patent is extended or adjusted under 35 U.S.C. 154(b) by 265 days.

(21) Appl. No.: 18/681,316

(22) PCT Filed: Aug. 5, 2022

(86) PCT No.: PCT/CA2022/051199

§ 371 (c)(1),
(2) Date: Feb. 5, 2024

(87) PCT Pub. No.: WO2023/015375

PCT Pub. Date: Feb. 16, 2023

(65) Prior Publication Data

US 2024/0339980 A1　　　Oct. 10, 2024

Related U.S. Application Data

(60) Provisional application No. 63/231,539, filed on Aug. 10, 2021.

(51) Int. Cl.
*H03G 11/08*　　　(2006.01)
*H03G 3/30*　　　(2006.01)

(52) U.S. Cl.
CPC ........... *H03G 11/08* (2013.01); *H03G 3/3005* (2013.01); *H03G 3/3089* (2013.01)

(58) Field of Classification Search
CPC .... H03G 11/08; H03G 3/3005; H03G 3/3089; H03G 7/00; H03G 5/02; H03G 3/20;
(Continued)

(56) References Cited

U.S. PATENT DOCUMENTS 6,856,196 B2 * 2/2005 Okubo .................. H03F 1/3282
330/136
8,254,404 B2　8/2012　Rabenko et al.
(Continued)

FOREIGN PATENT DOCUMENTS

EP　　　3108669　　　12/2016
JP　　2010-500613　　　1/2010
(Continued)

OTHER PUBLICATIONS

3GPP TS 26.445, v.16.1.0, "Codec for Enhanced Voice Services (EVS); Detailed Algorithmic Description", Jul. 2020, Chapter 4, pp. 21-26 and Chapter 5.2.6.1.13, pp. 237-238.
(Continued)

*Primary Examiner* — Xu Mei

(74) *Attorney, Agent, or Firm* — Fay Kaplun & Marcin, LLP

(57) ABSTRACT

A two-stage distortion limiter and method for limiting distortion in a sound signal, for example an output sound signal synthesis from a sound signal decoder. In a first stage, a level detector detects an amplitude value of the sound signal and computes a control gain using the detected amplitude value, and an attenuator reduces the level of the sound signal using the control gain. In a second stage, a saturation detector detects saturation in the sound signal and updates the control gain in response to detection of saturation.

40 Claims, 4 Drawing Sheets

(58) Field of Classification Search

CPC ....... G10L 19/26; G10L 19/005; H04R 25/43; H04R 2420/01; H04B 1/00

USPC ............................. 381/119, 22, 23, 104–109

See application file for complete search history.

(56) References Cited

U.S. PATENT DOCUMENTS

| | | | | |
|---|---|---|---|---|
| 8,965,011 | B2 * | 2/2015 | Helsloot | ................ H03G 9/025 |
| | | | | 379/406.01 |
| 9,060,236 | B2 | 6/2015 | Engdegard et al. | |
| 9,401,685 | B2 * | 7/2016 | Krishnaswamy | ........ H03G 3/20 |
| 10,020,002 | B2 * | 7/2018 | Chebiyyam | ............. G10L 19/06 |
| 2009/0281800 | A1 * | 11/2009 | LeBlanc | ............. G10L 21/0208 |
| | | | | 704/E19.01 |
| 2013/0148826 | A1 | 6/2013 | Chung et al. | |
| 2023/0006628 | A1 * | 1/2023 | Oshima | .................. H03G 11/04 |

FOREIGN PATENT DOCUMENTS

| | | |
|---|---|---|
| JP | 2011-530874 | 12/2011 |
| WO | 2008/021110 | 6/2008 |
| WO | 2010/017147 | 2/2010 |

OTHER PUBLICATIONS

"New WID on EVS Codec Extension for Immersive Voice and Audio Services", 3GPP WG-SA4 Meeting #94, S4-170749, Jun. 26-30, 2017, 4 sheets. http://www.3gpp.org/ftp/tsg_sa/WG4 CODEC/ TSGS4 94/Docs/S4-170749.zip.

"Information Technology—Programming Languages—C", International Standard ISO/IEC 9899;1999, Chapter 6.2.5, pp. 45-49 and Annex H, pp. 491-496.

Lu, "A digital realization of audio dynamic range control," ICSP '98. 1998 Fourth International Conference on Signal Processing (Cat. No. 98TH8344), 1998, pp. 1424-1427, vol. 2.

* cited by examiner

METHOD AND DEVICE FOR LIMITING OF OUTPUT SYNTHESIS DISTORTION IN A SOUND CODEC

TECHNICAL FIELD

The present disclosure relates to sound coding, in particular but not exclusively to a method and device (limiter) for limiting distortion in a sound signal, for example an output sound signal synthesis from a sound signal decoder. If a sound renderer is used, the distortion limiting method and device (limiter) may be implemented after or as part of the renderer.

In the present disclosure and the appended claims:

The term "sound" may be related to speech, audio and any other sound;

The term "stereo" is an abbreviation for "stereophonic";

The term "mono" is an abbreviation for "monophonic"; and

The term "multi-channel" may be related to two and more sound signals or sound codecs.

BACKGROUND

Historically, conversational telephony has been implemented with handsets having only one transducer to output sound only to one of the user's ears. In the last decade, users have started to use their portable handset in conjunction with a headphone to receive the sound over their two ears mainly to listen to music but also, sometimes, to listen to speech. Nevertheless, when a portable handset is used to transmit and receive conversational speech, the content is still mono but presented to the user's two ears when a headphone is used.

With the newest 3GPP (3rd Generation Partnership Project) speech coding Standard, designated Enhanced Voice Services (EVS), as described in Reference [1], of which the full content is incorporated herein by reference, the quality of the coded sound, for example speech and/or audio that is transmitted and received through a portable handset, has been significantly improved. The next natural step is to transmit stereo information such that the receiver gets as close as possible to a real-life audio scene that is captured at the other end of the communication link.

Efficient stereo coding techniques have been developed and used for low bit-rates. As a non-limitative example, the so-called parametric stereo coding constitutes one efficient technique for low bit-rate stereo coding. Parametric stereo encodes two, left and right channels as a mono signal using a common mono codec plus a certain amount of stereo side information (corresponding to stereo parameters) which represents a stereo image. The two input, left and right channels are down-mixed into a mono signal, for example by summing the left and right channels and dividing the sum by 2. The stereo parameters are then computed usually in transform domain, for example in the Discrete Fourier Transform (DFT) domain, and are related to so-called binaural or inter-channel cues. The binaural cues may comprise Interaural Level Difference (ILD), Interaural Time Difference (ITD) and Interaural Correlation (IC). Depending on the signal characteristics, stereo scene configuration, etc., some or all binaural cues are coded and transmitted to the decoder.

Further, in last years, the generation, recording, representation, coding, transmission, and reproduction of audio is moving towards an enhanced, interactive and immersive experience for the listener. The immersive experience can be described, for example, as a state of being deeply engaged or involved in a sound scene while sounds are coming from all directions. In immersive audio (also called 3D (Three-Dimensional) audio), the sound image is reproduced in all three dimensions around the listener, taking into consideration a wide range of sound characteristics like timbre, directivity, reverberation, transparency and accuracy of (auditory) spaciousness. Immersive audio is produced for a particular sound playback or reproduction system such as a loudspeaker-based system, an integrated reproduction system (sound bar), or headphones. Then, interactivity of a sound reproduction system may include, for example, an ability to adjust sound levels, change positions of sounds, or select different languages for the reproduction.

In recent years, 3GPP (3rd Generation Partnership Project) started working on developing a 3D sound codec for immersive services called IVAS (Immersive Voice and Audio Services), based on the EVS codec (See Reference [2] of which the full content is incorporated herein by reference).

In sound codecs, the output sound signal may be corrupted by several types of distortion.

Distortion may be caused by clippings where samples of sound signal have a value higher or lower than a certain threshold. This situation can typically happen when a sample of sound signal a) is converted from a floating-point representation to a fixed-point representation, b) is converted from one fixed-point representation to another fixed-point representation with a shorter bit length (e. g. from long integer to short integer (e. g. in C99 programming language standard as described in Reference [3] of which the full content is incorporated herein by reference, Long signed integer type is capable of containing the $[-2,147,483,647, +2,147,483,647]$ 32-bit range while Short signed integer type is capable of containing the $[-32,767, +32,767]$ 16-bit range), c) as a result of an instability in the decoding algorithm of the sound codec, d) during rendering when a sound (voice and/or audio) signal is manipulated, down-mixed etc. When one of these situations occurs, the amplitude of the sound signal samples can saturate and it is thus clipped, or limited, resulting in a perceptually annoying sound.

In order to reduce such clippings, Automatic Gain Control (AGC) as implemented in the ACELP core of the mono EVS codec (Reference [1]) can be used. The AGC is a closed-loop feedback algorithm regulating and maintaining the varying amplitude of sound signal samples within limits suitable for processing of these sound signal samples without distortion. AGC is designed to regulate sound signal samples in time domain with no additional delay.

The problem of saturation is even more challenging in multi-channel codecs, typically when the number of decoded channels is higher than the number of output channels, or the decoded channels are correlated. An example is the rendering of decoded multi-channel audio to a binaural output.

Saturation often occurs also as a consequence of an instability in the decoding algorithm, for example when the long-term synthesis filter used in a CELP-based sound codec is unstable or when a received bitstream is corrupted by frame erasures or bit errors.

SUMMARY

The present disclosure relates to a method and device (limiter) for limiting distortion in a sound signal. When a sound renderer is implemented following a sound signal decoder, the method and device (limiter) for limiting distortion in the sound signal may be performed on the rendered sound signal.

According to a first aspect, the present disclosure relates to a two-stage method for limiting distortion in a sound signal, comprising, in a first stage, detecting an amplitude value of the sound signal and computing a control gain using the detected amplitude value, attenuating the level of the sound signal using the control gain and, in a second stage, detecting saturation in the sound signal and updating the control gain in response to detection of saturation.

According to a second aspect, the present disclosure relates to a two-stage method for limiting distortion in an output sound signal synthesis from a sound signal decoder. In a first stage, an amplitude value of the output sound signal synthesis is detected, a control gain is computed using the detected amplitude value, and the level of the output sound signal synthesis is attenuated using the control gain. In a second stage, saturation in the output sound signal synthesis is detected and the control gain is updated in response to detection of saturation.

According to another aspect, there is provided a two-stage distortion limiter for limiting distortion in a sound signal, comprising (a) a first stage comprising a level detector for detecting an amplitude value of the sound signal and for computing a control gain using the detected amplitude value, and an attenuator of the level of the sound signal using the control gain, and (b) a second stage comprising a saturation detector for detecting saturation in the sound signal and for updating the control gain in response to detection of saturation.

According to a further aspect, there is provided a two-stage distortion limiter for limiting distortion in an output sound signal synthesis from a sound signal decoder, comprising (a) a first stage comprising a level detector for detecting an amplitude value of the output sound signal synthesis and for computing a control gain using the detected amplitude value, and an attenuator of the level of the output sound signal synthesis using the control gain; and (b) a second stage comprising a saturation detector for detecting saturation in the output sound signal synthesis and for updating the control gain in response to detection of saturation.

The foregoing and other features will become more apparent upon reading of the following non-restrictive description of an illustrative embodiment of the two-stage distortion limiter and distortion limiting method, given by way of example only with reference to the accompanying drawings.

DETAILED DESCRIPTION

Figure 1:
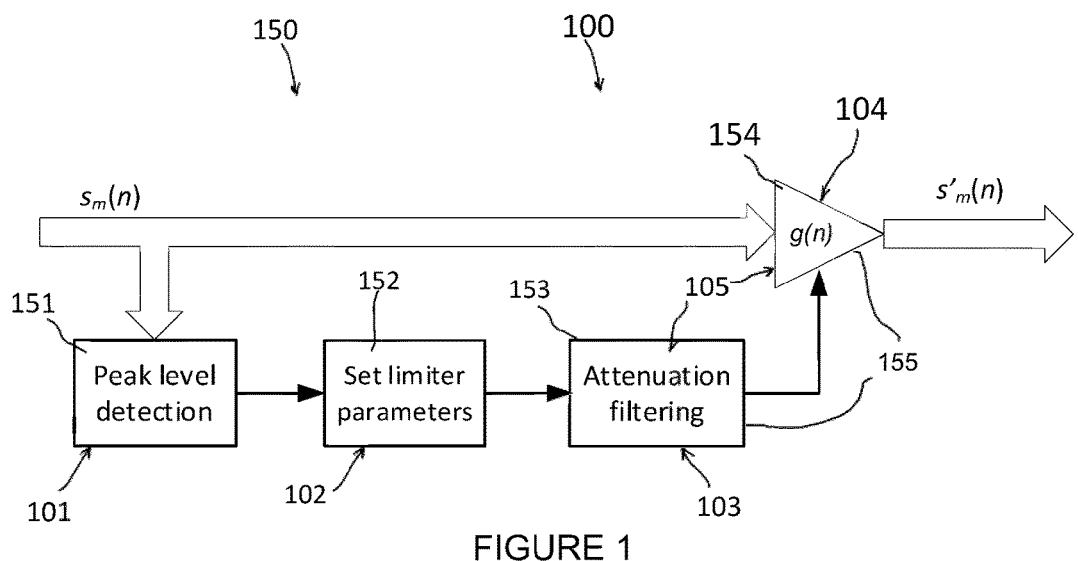
FIG. 1 is a schematic block diagram illustrating concurrently an example implementation of a one-stage multi-channel distortion limiter, and a corresponding distortion limiting method.

The present disclosure is concerned with limitation of distortion in an output sound signal synthesis from the sound signal decoder of a sound codec. As indicated earlier in the present disclosure, if a sound renderer is implemented following the sound signal decoder, the method and device (limiter) for limiting distortion in the output sound signal synthesis from the sound signal decoder may be performed on the rendered sound signal. Distortion may happen as a consequence of an unstable decoding process. In particular, the present disclosure introduces a second-stage algorithm in the distortion limiter and distortion limiting method for detecting and limiting distortion caused for example by a) bitstreams with bit errors or other types of corrupted bitstreams, and b) saturations in general. The distortion limiter can be implemented in a mono, stereo, or multi-channel sound signal decoder for example just before the final float to integer conversion, or before long integer to short integer conversion. When the distortion limiter detects distortion such as saturation, an attenuation is applied which results in a much more pleasant output sound signal synthesis.

An example of simple distortion limiter and distortion limiting method involving saturation control is the so-called Automatic Gain Control (AGC) applied in the EVS codec to the decoded sound signal at the internal sampling rate. AGC as used in the EVS codec is described in Reference [1]. The AGC algorithm consists of two steps. First, a frame factor $\beta_1$ is computed using relations (1) and (2):

$$\beta_1 = \begin{cases} 0.5 - \dfrac{15,000}{s_{max}}, & \text{if } s_{max} > 30,000 \\ 0, & \text{otherwise} \end{cases} \tag{1}$$

$$s_{max} = \max[\text{abs}(s(n))], \, n = 0, \ldots, N-1, \tag{2}$$

where s (n), n=0, . . . , N−1, is the deemphasized sound signal synthesis at the internal sampling rate, and N is the frame length in samples.

Then, the frame factor $\beta_1$ is used to update a long-term AGC factor $\beta_2$ using relation (3):

$$\beta_2(n) = 0.99 \cdot \beta_2(n-1) + 0.01 \cdot \beta_1 \tag{3}$$

Finally, each sample of the output sound signal synthesis is updated using a closed-loop feedback as expressed in relation (4):

$$s'(n) = (1 - \beta_2(n)) \cdot s(n) - \beta_2(n) \cdot s(n-1), \, n = 0, \ldots, N-1, \tag{4}$$

The above described AGC limiter was adopted in several recent speech and audio mono coding standards, such as EVS. For stereo and multi-channel codecs, more elaborated distortion limiter and distortion limiting method are implemented. In the present disclosure, the distortion limiter and corresponding distortion limiting method is implemented by way of example in a 3D sound coding framework, i.e. in the IVAS framework.

1. Distortion Limiter in Multi-Channel Codecs

In a multi-channel codec such as IVAS outlined in Reference [2], distortion such as saturations may occur in one, several, or all output channels. The attenuation can then be applied to all output channels regardless if any of them originally contains saturations or not in order to preserve the spatial characteristics of the output sound such as audio/speech.

An example implementation of a distortion limiter in a multi-channel codec can be a general non-specific digital limiter, for example the audio dynamic range controller with variable parameters as described in Reference [4], of which the full content is incorporated herein by reference. Any other distortion limiter can be used without departing from the spirit and scope of the present disclosure. In the following description, distortion level limitation is used and comprises generating a control gain and using a first order IIR (Infinite Impulse Response) filter for attack and release time processing. FIG. 1 is a schematic block diagram illustrating concurrently such an example implementation of one-stage multi-channel distortion limiter and corresponding distortion limiting method.

The distortion limiting method and device (limiter) can be used in several parts of the sound coding, decoding and/or reproduction system, e.g. in a pre-renderer at the coding end, as part of the decoder, after the decoder, as part of the sound renderer, or after the sound renderer just before outputting sound signals from the system. For the purpose of simplifying the description, but without restricting the scope of the present disclosure, the terms used in the present disclosure focus on the implementation of the distortion limiting method and device (limiter) after the sound renderer.

Referring to FIG. 1, the example implementation of one-stage multi-channel distortion limiting method 100 comprises an operation 101 of output sound signal synthesis level detection, an operation 102 of setting limiter parameters, and an operation 105 of attenuation filtering that can be split, as illustrated in FIG. 1, into a "gain filtering" sub-operation 103 as described for example by relation (7) and a "gain-applying" sub-operation 104 as described for example by relation (8).

$S_m(n)$ (which is the sound signal to be distortion limited in the example implementation of FIG. 1) is the m-th channel of the output sound signal synthesis (for example speech and/or audio), where $m=0, \ldots, M-1$, M is the number of output channels, $n=0, \ldots, N-1$ is a time sample index, and N is the frame length in samples. As known to those of ordinary skill in the art, the output sound signal synthesis is processed in successive blocks of output sound signal synthesis samples called frames (hereinafter output sound signal synthesis processing frames).

To perform operation 101, the one-stage multi-channel distortion limiter 150 of FIG. 1 comprises a level detector 151 to detect an amplitude value of the sound signal synthesis. In the illustrated non-limitative implementation, the level detector is a peak level detector 151 to detect a maximum absolute value p (also called "peak value") of the sound signal synthesis samples of all output channels m of the output sound signal synthesis in the current frame using, for example, relation (5):

$$p = \max[\text{abs}(s_m(n))], n = 0, \ldots, N-1, m = 0, \ldots, M-1. \quad (5)$$

The peak level detector 151 then uses the detected peak value p to compute a control gain (also called "gate attenuation"), denoted as $g_c$. The peak level detector 151 first compares the peak value p with a limiter threshold (also called "gate level") denoted as $\Omega$. If $p \leq \Omega$, the peak level detector 151 then sets the control gain $g_c=1$. If $p>\Omega$, however, the peak level detector 151 computes the control gain using, for example, relation (6):

$$g_c = \max\left[\Gamma_1, \frac{\Omega}{p}\right] \quad (6)$$

where the parameter $\Gamma_1$ denotes a lowest gain limit, for example $\Gamma_1=0.15$. Of course, other values of parameter $\Gamma_1$ can be implemented. Limiting the control gain $g_c$ equal to or below $\Gamma_1$ is usually not expected and in general cannot happen in stable sound signal decoders, typically sound signal decoders receiving bitstreams not corrupted by bit errors. If gain limiting is not implemented, however, there might happen that a longer segment of output sound signal synthesis is attenuated too strongly (up to close to zero) and thus the sound might become inaudible. For example, in a non-limitative illustrative implementation, if the distortion limiter 150 is intended to limit the output sound signal synthesis to short integer values in a range of $[-32,768; 32,767]$, the limiter threshold can be set to $\Omega=32,750$.

To perform operation 102, the one-stage multi-channel distortion limiter 150 of FIG. 1 comprises a calculator 152 of limiter parameters that are computed to generate the desired dynamic characteristics as taught by Reference [4]. For example, an attack/release time parameter $\gamma$ is computed and is responsible for defining a shorter or longer attack/release time. The attack/release time parameter $\gamma$ provides a control how quickly the distortion limiter acts and can be in general subject to adjustment or tuning during development. In more detail:

The attack parameter controls the time taken by the distortion limiter to reduce the control gain after the detected peak value of the output sound signal synthesis has exceeded the limiter threshold Q.

The release parameter controls the time it takes for the control gain to return to its normal level of 1.0 after the detected peak value of the output sound signal synthesis fell below the limiter threshold Q.

To perform operation 103, the one-stage multi-channel distortion limiter 150 of FIG. 1 comprises an attenuator 155 of the level of the output sound signal synthesis $S_m(n)$ comprising a gain filter 153 such as a first order IIR low-pass filter using the attack/release time parameter $\gamma$ to obtain a gain g (n) per sample of the output sound signal synthesis. Filter 153 can be described, for example, by relation (7):

$$g(n) = \gamma \cdot [g(n-1) - g_c] + g_c \quad (7)$$

where $\gamma$ denotes the above-mentioned attack/release time parameter. To perform operation 103, the attenuator 155 of FIG. 1 also comprises an amplifier 154 for applying the gain g(n) to every n-th sample of all the channels m of the output sound signal synthesis $S_m(n)$ to obtain a distortion-limited output sound signal synthesis $S'_m(n)$, using for example relation (8):

$$s'_m(n) = g(n) \cdot s_m(n), n = 0, \ldots, N-1, m = 0, \ldots, M-1. \quad (8)$$

While the above described one-stage (first stage) procedure is able to adequately handle common situations in multi-channel codecs, it is not sufficiently performant in situations when the output sound signal synthesis $S_m(n)$ is corrupted by a) bitstreams with bit errors or other highly corrupted bitstreams, and b) strong saturations in general. To cope with this deficiency, a second stage is added to the distortion limiter 150 and distortion limiting method 100 to detect and limit saturations.

2. Second Stage of Distortion Limiter

Figure 2:
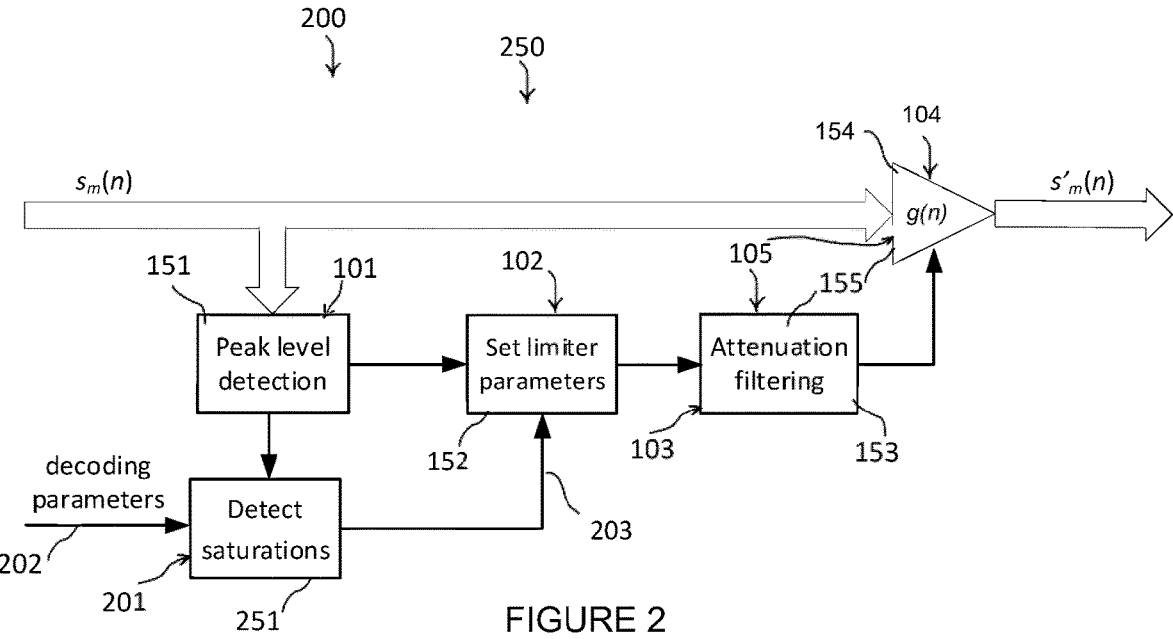
FIG. 2 is a schematic block diagram of a two-stage multi-channel distortion limiter, and a corresponding distortion limiting method.

FIG. 2 is a schematic block diagram of a two-stage multi-channel distortion limiter 250, and corresponding distortion limiting method 200.

Referring to FIG. 2, the example implementation of two-stage multi-channel distortion limiting method 200 comprises, as a first stage, the operation 101 of output sound signal synthesis level detection, the operation 102 of setting limiter parameters, and the operation 105 of attenuation filtering including the gain filtering sub-operation 103 and the gain-applying sub-operation 104 as described in relation to FIG. 1. In the same manner, the two-stage multi-channel distortion limiter 250 of FIG. 2 comprises, as the first stage, the sound signal synthesis level detector such as the peak level detector 151, the calculator 152 of limiter parameters, and the attenuator 155 including the gain filter 153 and the amplifier 154 as also described with reference to FIG. 1.

The two-stage multi-channel distortion limiting method 200 comprises, as a second stage, an operation 201 of detecting saturations in the output sound signal synthesis $S_m(n)$. The two-stage multi-channel distortion limiter 250 of FIG. 2 comprises, as the second stage, a saturation detector 251 for performing operation 201.

The second stage of the two-stage multi-channel distortion limiter 250 and corresponding distortion limiting method 200 are designed for detecting saturations, in particular strong saturations of the output sound signal synthesis $S_m(n)$. The term "strong saturations" is intended to designate saturations with an unexpectedly high level, e. g. higher than $1/\Gamma_1$ times the maximum desired output sound signal level. Although the illustrative implementation refers to detection of strong saturations as defined above, it is within the scope of the present disclosure, in view of improving the output sound signal synthesis, to also detect weaker saturations by adapting the values of the parameters, thresholds, counters, constants, etc., used in the saturation detector 251 and the corresponding saturation detecting method 201 as described herein after.

In the described illustrative implementation, the second stage (saturation detector 251 and saturation detection operation 201) produces an output 203 indicative of (a) a decision if additional attenuation is to be applied to the output sound signal synthesis $S_m(n)$ and (b) an extent of the attenuation to be applied to the output sound signal synthesis $S_m(n)$ indicated by an updated control gain $g_c$.

The second stage cannot only be implemented in the distortion limiter of FIG. 1, but also in any other distortion limiter including the above mentioned mono AGC limiter in which case the second stage is used to alter the frame factor $\beta_1$ from relation (1) and thus the long-term AGC factor $\beta_2$ from relation (3).

Figure 3:
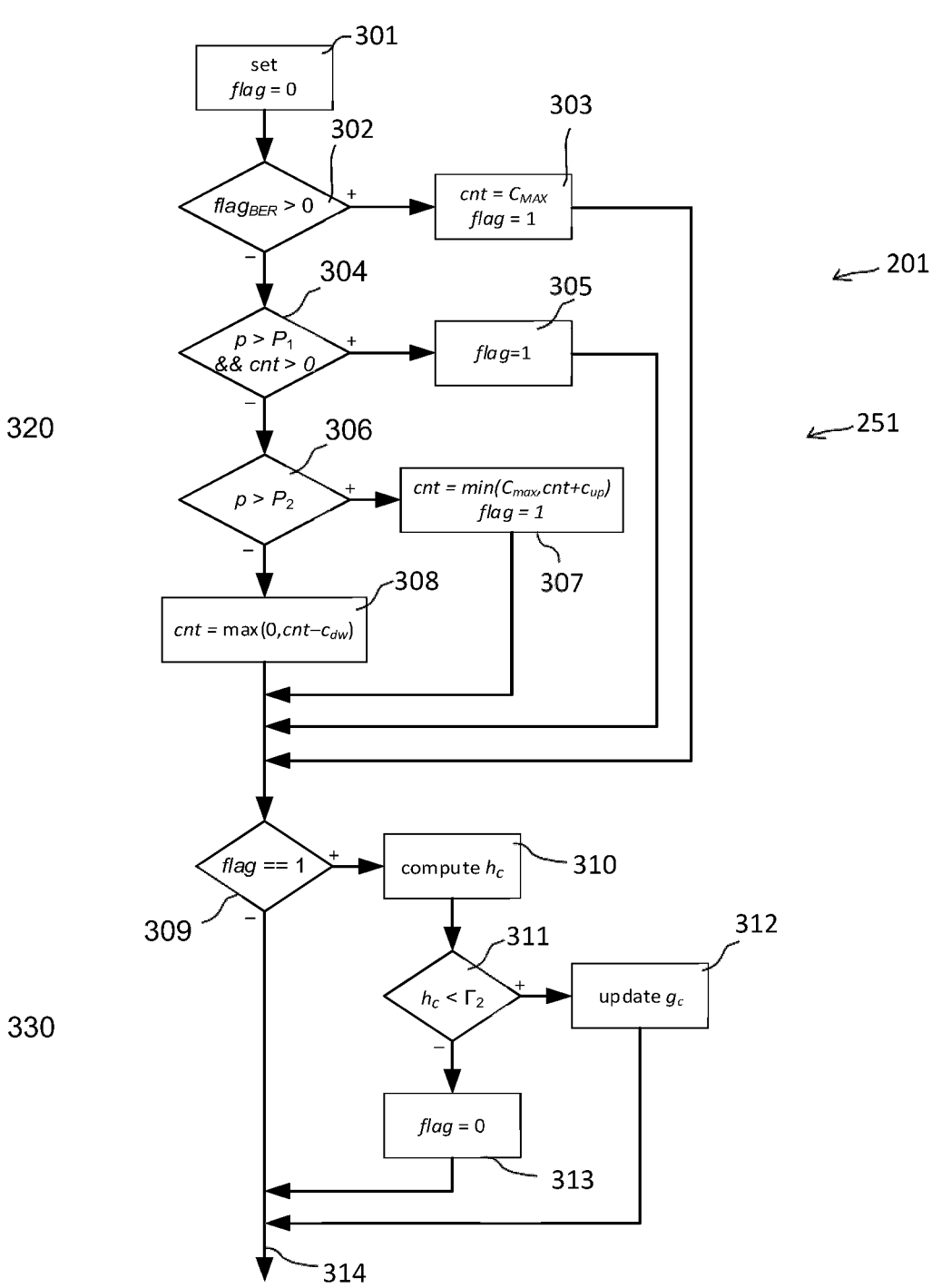
FIG. 3 is a schematic block diagram illustrating concurrently a saturation detector forming part of the device of FIG. 2, and a corresponding saturation detecting method.

FIG. 3 is a schematic block diagram illustrating concurrently the saturation detector 251 and the corresponding saturation detecting method 201 of FIG. 2. The saturation detector 251 produces a saturation detection flag flag indicating whether saturation was detected or not, and an updated control gain $g_c$.

Referring to FIG. 3, the saturation detecting operation 201 and the corresponding saturation detector 251 initializes (see 301), at the beginning of every output sound signal synthesis processing frame, the saturation detection flag flag to 0. It should be noted that the saturation detector 251 performs saturation detection on each of the M audio channels in every sound signal synthesis processing frame.

The saturation detector 251 and the corresponding saturation detecting method 201 then comprises two parts:

a first calculator 320 which updates a saturation detection counter cnt which stores a metric measuring probability that saturation, in particular strong saturation is present in a current output sound signal synthesis processing frame and produces the saturation detection flag flag; and a second calculator 330 which, as described herein above, (a) decides if additional attenuation is to be applied to the output sound signal synthesis $S_m(n)$ and (b) determines an extent of the attenuation to be applied to the output sound signal synthesis $S_m(n)$ by producing an updated control gain $g_c$.

The first calculator 320 of the saturation detector 251 and the corresponding saturation detecting method 201 will now be described.

The first calculator 320 of the saturation detector 251 and the corresponding saturation detecting method 201 starts with a decision (see 302) whether bit errors, signalled from the algorithm of the sound signal decoder by a parameter $flag_{BER}$, were detected in the received bitstream of the current output sound signal synthesis processing frame or not. If bit errors were detected, indicated by parameter $flag_{BER}==1$ (see 302), the saturation detection counter cnt is updated to its maximum value $cnt=C_{MAX}$ (see 303) and the saturation detection flag flag is set to its saturation indicating value flag=1 (see 303). The saturation detection is then continued by the second calculator 330 (starting at 309) of the saturation detector 251 and the corresponding saturation detecting method 201. It should be noted that updating the saturation detection counter cnt to its maximum value $C_{MAX}$ might be also driven by other decoding parameter(s) 202 (FIG. 2) from the sound signal decoder. In the present non-limitative example implementation, $C_{MAX}=50$. It is noted that the saturation detection counter cnt is set to cnt=0 at decoder initialization.

Still referring to FIG. 3, if the parameter $flag_{BER}==0$ (see 302), indicating that no bit errors are detected in the bitstream received by the sound signal decoder, the saturation detector 251 and the corresponding saturation detecting method 201 continues with a second decision (see 304) using the detected peak value p from relation (5). If the peak value p is greater than a given threshold $P_1$ and the saturation detection counter cnt>0, the saturation detection flag is set to its saturation indicating value flag=1 (see 305). The saturation detection is then continued in the second calculator 330 (starting at 309) of the saturation detector 251 and the corresponding saturation detecting method 201. In the present non-limitative example implementation, $P_1=3\cdot\Omega$ where $\Omega$ is the limiter threshold from relation (6).

If (a) the parameter $flag_{BER}==0$ (see 302), indicating that no bit errors are detected in the bitstream received by the sound signal decoder, (b) the peak value p is equal to or lower (not larger) than the threshold $P_1$ and/or the saturation detection counter cnt=0 (see 304), the first calculator 320 of the saturation detector 251 and the corresponding saturation detecting method 201 continues with a third decision (see 306) whether the peak value p is greater than a given threshold $P_2$. For the purpose of decision 306, the saturation detection counter cnt is not used to try to detect instabilities of the sound signal decoder other than that caused by bit errors. If $p>P_2$ (see 306), the saturation detection counter cnt is updated to the minimum between $C_{MAX}$ and the sum of cnt+$c_{up}$ (it is ensured that the cnt value does not exceed the maximum value $C_{MAX}$) and the saturation detection flag is set to flag=1 (see 307). In the present non-limitative example implementation $P_2=10\cdot\Omega$ (where $\Omega$ is the limiter threshold from relation (6)) and the constant $c_{up}=20$ represents an incrementation step up. The saturation detection then continues in the second calculator 330 (starting at 309) of the saturation detector 251 and the corresponding saturation detecting method 201.

If the parameter flag$_{BER}$==0 (see 302), indicating that no bit errors are detected in the bitstream received by the sound signal decoder, (b) the peak value p is equal to or lower (not larger) than the threshold $P_1$ and/or the saturation detection counter cnt=0 (see 304), and (c) the peak value p is equal to or lower (not larger) than the threshold $P_2$ (see 306), the first calculator 320 updates the saturation detection counter cnt (see 308) to the maximum between 0 and the difference cnt-$c_{dw}$ (it is ensured that the minimum value of the detection counter cnt is 0). In the present non-limitative example implementation, the constant $c_{dw}=1$ represents an incrementation step down. The saturation detection then continues in the second calculator 330 (starting at 309) of the saturation detector 251 and the corresponding saturation detecting method 201.

At this point, the contribution of the first calculator 320 of the saturation detector 251 and the saturation detecting method 201 is completed. As can be appreciated, the first calculator 320 takes into consideration a plurality of factors, including bit errors in the bitstream (parameter flag$_{BER}$), two thresholds $P_1$ and $P_2$ applied to the detected peak value p, and the updated counter cnt for an accurate determination of the saturation detection indicating value "1" or no saturation detection indicating value "0" of the flag flag.

In the second calculator 330 of the saturation detector 251 and the corresponding saturation detecting method 201, if the saturation detection flag flag is equal to 0 (see 309), the saturation detecting method 201 is ended and no additional attenuation is requested at the output 314 (corresponding to 203 in FIG. 2) of the second stage of the two-stage multi-channel distortion limiter 250.

On the other hand, if the saturation detection flag flag=1 (see 309), the second calculator 330 of the saturation detector 251 and the corresponding saturation detecting method

201 computes (see 310) a gain correction factor $h_c$ using, for example, relation (9):

$$h_c = \frac{\Omega}{p} \tag{9}$$

where $\Omega$ is the above defined limiter threshold and p the above defined peak value.

If the gain correction factor $h_c$ is lower than a certain, for example experimentally found threshold $\Gamma_2$, for example $\Gamma_2=0.3$, (see 311), the second calculator 330 updates (see 312) the control gain $g_c$ from relation (6) using, for example, relation (10):

$$g_c = \frac{h_c}{\alpha} \tag{10}$$

where $\alpha$ is an additional correction factor. In the present, non limitative example implementation $\alpha=3.0$.

Otherwise, if $h_c \geq \Gamma_2$ (see 311), the second calculator 330 sets the saturation detection flag to flag=0 (see 313) and performs no updating of the control gain $g_c$.

The function of the threshold $\Gamma2$ is to update the gain correction factor $h_c$ only when it is adequately low. Also, the function of the additional correction factor $\alpha$ is to control the strength of the additional limitation of the control gain $g_c$ (see relation (10)).

The second calculator 330 of the saturation detector 251 and the corresponding saturation detecting method 201 thus ends with possible update of the control gain $g_c$ which the two-stage multi-channel distortion limiter 250 then takes into account. Moreover, if the saturation detector 251 updates (see 312) the control gain $g_c$, it holds the saturation detection flag to the value flag=1 at the output 314 and the parameter $\Gamma_1$ in relation (6) is set to 0. Thus relation (6) used in the peak level detector 151 of the first stage of the two-stage multi-channel distortion limiter 250 is changed, for example, to relation (11):

$$g_c = \frac{\Omega}{\alpha \cdot p} \tag{11}$$

In the source code, as used in the IVAS framework, the two-stage multi-channel distortion limiter 250 and corresponding distortion limiting method 200 could be implemented as follows:

```
/ *! r: apply_strong_limiting flag */
static int16_t detect_strong_saturations (
    const int16_t BER_detect,       /*  i  :   BER detect flag                    */
    int16_t *strong_saturation_cnt, /*  i/o:   counter of strong saturations      */
    const float max_val,            /*  i  :   maximum absolute value             */
    float *frame_gain               /*  i/o:   frame gain value                   */
)
{
    int16_t apply_strong_limiting;
    apply_strong_limiting = 0;
    if ( BER_detect )
    {
        *strong_saturation_cnt = 50;
        apply_strong_limiting = 1;
    }
    else if ( max_val > 3 * LIMITER_THRESHOLD && *strong_saturation_cnt > 0 )
    {
        apply_strong_limiting = 1;
    }
```

-continued

```
else if ( max_val > 10 * LIMITER_THRESHOLD )
{
    *strong_saturation_cnt += 20;
    *strong_saturation_cnt = min( *strong_saturation_cnt, 50 );
    apply_strong_limiting = 1;
}
else
{
    ( *strong_saturation_cnt )--;
    *strong_saturation_cnt = max( *strong_saturation_cnt, 0 );
}
if ( apply_strong_limiting )
{
    if ( *frame_gain < 0.3f )
    {
        *frame_gain /= 3.0f;
    }
    else
    {
        apply_strong_limiting = 0;
    }
}
return apply_strong_limiting;
```

3. Performance

Figure 4:
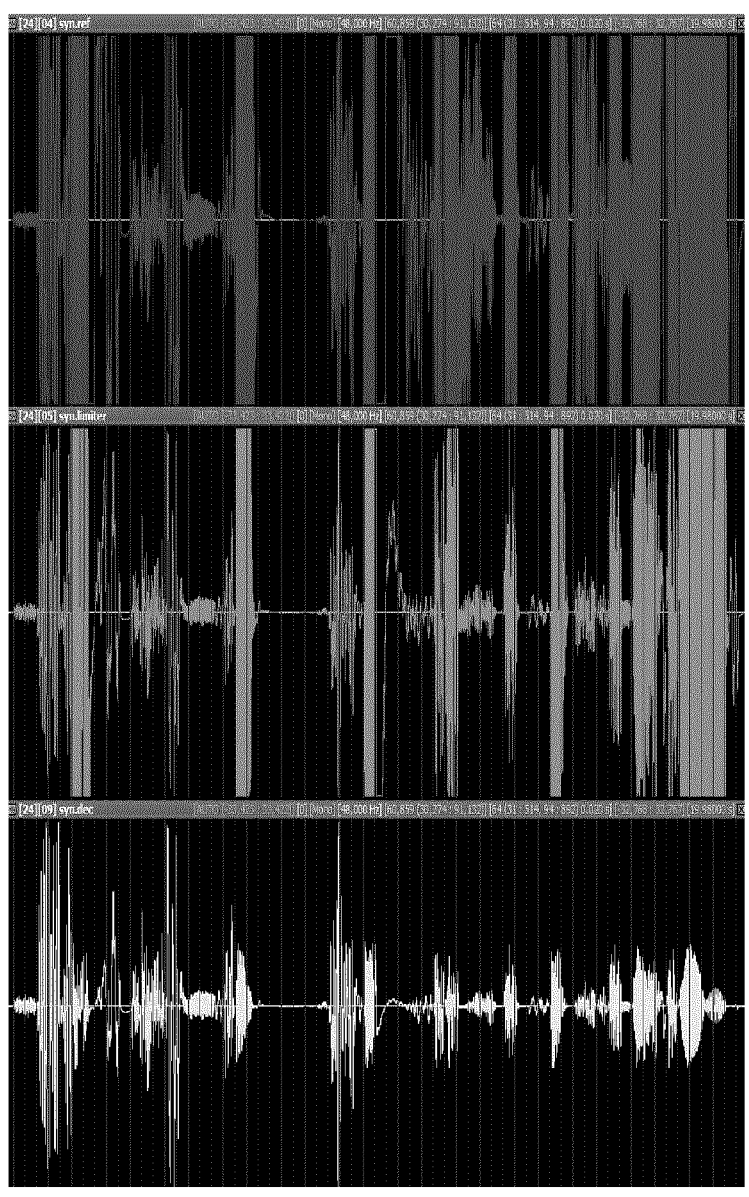
FIG. 4 is an illustration showing the impact of the two-stage distortion limiter and distortion limiting method on the output sound signal synthesis.

FIG. 4 is an illustration showing the impact of the distortion limiter 250 and distortion limiting method 200 on the output sound signal synthesis, in the non limitative example when a bitstream corrupted by bit errors is received by an EVS sound signal decoder.

From FIG. 4, it is noted that the output sound signal synthesis is very distorted when no distortion limiter is used (top graph of FIG. 4). The number of distortions, or energy overshoots, is reduced when a one-stage distortion limiter as illustrated in FIG. 1 is used (middle graph of FIG. 4) and further significantly reduced when a two-stage distortion limiter as illustrated in FIG. 2 is employed (bottom graph of FIG. 4).

For illustration, an example of number of clippings in a 40 seconds long sound signal synthesis is shown below:

| variant | number of clippings |
| --- | --- |
| No limiter | 184,685 |
| One-stage limiter | 55,725 |
| Two-stage limiter | 131 |

4. Implementation Variants

The present disclosure is presented in a context of a codec implemented in the floating-point arithmetic. When implemented in the fixed-point arithmetic with a limited data-type length, some logic described above could not properly work and would need to be tuned. As an example, instead of comparing the peak value p against thresholds $P_1$ and $P_2$ in the first part of the saturation detector 251 and the corresponding saturation detecting method 201, it is possible to introduce a different logic. An example could be a logic based on a counter of number of clippings (output sound signal synthesis before the distortion limiter has sample values equal to maximum or minimum value of the fixed-point data-type resolution) and/or number of zero crossings.

5. Hardware Implementation

Figure 5:
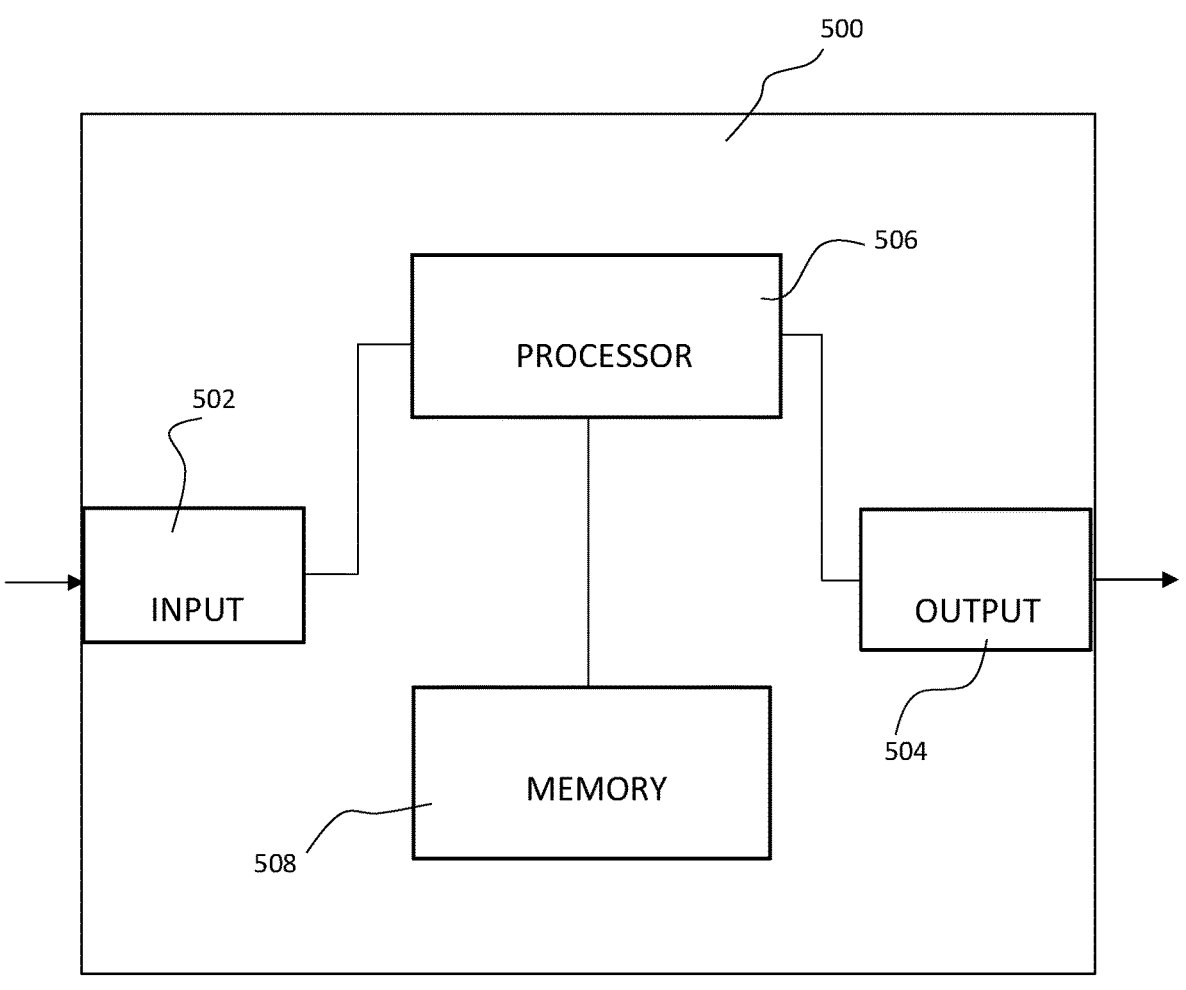
FIG. 5 is a simplified block diagram of an example configuration of hardware components implementing the distortion limiter and distortion limiting method.

FIG. 5 is a simplified block diagram of an example configuration of hardware components forming the above described distortion limiter and distortion limiting method.

The distortion limiter may be implemented as a part of a mobile terminal, as a part of a portable media player, an audio format converter or any similar device. The distortion limiter (identified as 500 in FIG. 5) comprises an input 502, an output 504, a processor 506 and a memory 508.

The input 502 is configured to receive the input sound signal synthesis, in digital or analog form. The output 504 is configured to supply the output, distortion limited sound signal synthesis. The input 502 and the output 504 may be implemented in a common module, for example a serial input/output device.

The processor 506 is operatively connected to the input 502, to the output 504, and to the memory 508. The processor 506 is realized as one or more processors for executing code instructions in support of the functions of the various components of the distortion limiter as illustrated in FIGS. 1-3.

The memory 508 may comprise a non-transient memory for storing code instructions executable by the processor(s) 506, specifically, a processor-readable memory comprising/storing non-transitory instructions that, when executed, cause a processor(s) to implement the operations and components of the distortion limiting method and distortion limiter as described in the present disclosure. The memory 508 may also comprise a random access memory or buffer(s) to store intermediate processing data from the various functions performed by the processor(s) 506.

Those of ordinary skill in the art will realize that the description of the distortion limiter and distortion limiting method is illustrative only and is not intended to be in any way limiting. Other embodiments will readily suggest themselves to such persons with ordinary skill in the art having the benefit of the present disclosure. Furthermore, the disclosed distortion limiter and distortion limiting method may be customized to offer valuable solutions to existing needs and problems of encoding and decoding sound.

In the interest of clarity, not all of the routine features of the implementations of the distortion limiter and distortion limiting method are shown and described. It will, of course, be appreciated that in the development of any such actual implementation of the distortion limiter and distortion limiting method, numerous implementation-specific decisions may need to be made in order to achieve the developer's specific goals, such as compliance with application-, system-, network- and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of sound processing having the benefit of the present disclosure.

In accordance with the present disclosure, the components/processors/modules, processing operations, and/or data structures described herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAS), application specific integrated circuits (ASICs), or the like, may also be used. Where a method comprising a series of operations and sub-operations is implemented by a processor, computer or a machine and those operations and sub-operations may be stored as a series of non-transitory code instructions readable by the processor, computer or machine, they may be stored on a tangible and/or non-transient medium.

The distortion limiter and distortion limiting method as described herein may use software, firmware, hardware, or any combination(s) of software, firmware, or hardware suitable for the purposes described herein.

In the distortion limiter and distortion limiting method as described herein, the various operations and sub-operations may be performed in various orders and some of the operations and sub-operations may be optional.

Although the present disclosure has been described hereinabove by way of non-restrictive, illustrative embodiments thereof, these embodiments may be modified at will within the scope of the appended claims without departing from the spirit and nature of the present disclosure.

REFERENCES

The present disclosure mentions the following references, of which the full content is incorporated herein by reference:
[1] 3GPP TS 26.445, v.16.1.0, "Codec for Enhanced Voice Services (EVS); Detailed Algorithmic Description", July 2020.
[2] 3GPP SA4 contribution S4-170749 "New WID on EVS Codec Extension for Immersive Voice and Audio Services", SA4 meeting #94, Jun. 26-30, 2017, http://www.3gpp.org/ftp/tsg_sa/WG4_CODEC/TSGS4_94/Docs/S4-170749.zip
[3] "Information Technology-Programming Languages-C", International Standard ISO/IEC 9899:1999.
[4] Luzheng Lu, "A digital realization of audio dynamic range control," ICSP '98. 1998 Fourth International Conference on Signal Processing (Cat. No. 98TH8344), 1998, pp. 1424-1427 vol. 2, doi: 10.1109/ICOSP.1998.770888.

The following embodiments (Embodiments 1 to 32) are part of the present description relating the invention.

Embodiment 1: A detector of saturation of an output sound signal synthesis from a sound signal decoder, comprising (a) a first calculator of a saturation detection flag indicative of detection of saturation of the output sound signal synthesis, and (b) a second calculator responsive to the saturation detection flag for deciding if additional attenuation is to be applied to the output sound signal synthesis and determining an extent of the attenuation to be applied to the output sound signal synthesis.

Embodiment 2: The saturation detector according to embodiment 1, wherein the output sound signal synthesis comprises a plurality of channels and wherein the saturation detector is applied to every channel of the output sound signal synthesis.

Embodiment 3: The saturation detector according to embodiment 1 or 2, wherein the first calculator initializes the saturation detection flag at the beginning of output sound signal synthesis processing frames.

Embodiment 4: The saturation detector according to any one of the embodiments 1 to 3, wherein the first calculator updates a saturation detection counter which stores a probability that saturation is present in a current output sound signal synthesis processing frame.

Embodiment 5: The saturation detector according to embodiment 4, wherein the sound signal decoder produces a parameter indicative of bit errors in a bitstream received by the sound signal decoder, and the first calculator updates the saturation detection counter to a maximum value thereof and sets the saturation detection flag to a saturation indicating value when the produced parameter indicates bit errors in the bitstream.

Embodiment 6: The saturation detector according to embodiment 4 or 5, wherein the first calculator sets the saturation detection flag to a saturation indicating value when a detected sound signal synthesis amplitude value is larger than a given threshold and the saturation detection counter is larger than 0.

Embodiment 7: The saturation detector according to any one of the embodiments 4 to 6, wherein, if a detected sound signal synthesis amplitude value is larger than a given threshold, the first calculator sets the saturation detection flag to a saturation indicating value and updates the saturation detection counter to the minimum between a maximum value of the saturation detection counter and the sum of the saturation detection counter and a constant.

Embodiment 8: The saturation detector according to embodiment 4, wherein the first calculator sets the saturation detection flag to a saturation indicating value if (a) a parameter produced by the sound signal decoder indicates bit errors in a bitstream received by the sound signal decoder, (b) a detected sound signal synthesis amplitude value is larger than a first given threshold and the saturation detection counter is larger than 0, or (c) the detected amplitude value is larger than a second given threshold.

Embodiment 9: The saturation detector according to embodiment 8, wherein the first and second thresholds are related to a sound signal synthesis limiter threshold.

Embodiment 10: The saturation detector according to embodiment 4, wherein the first calculator updates the saturation detection counter to the maximum between 0 and a difference between the saturation detection counter and a constant if (a) a parameter produced by the sound signal decoder indicates no bit errors in a bitstream received by the sound signal decoder, (b) a detected sound signal synthesis amplitude value is equal to or lower that a first given threshold and/or the saturation detection counter is equal to 0, and (c) the detected amplitude value is equal to or lower than a second given threshold.

Embodiment 11: The saturation detector according to any one of the embodiments 1 to 10, wherein the second calculator is responsive to the saturation detection flag for updating a control gain for application to the sound signal synthesis.

Embodiment 12: The saturation detector according to embodiment 11, wherein the second calculator updates the control gain in response to the saturation detection flag equal to a saturation indicating value.

Embodiment 13: The saturation detector according to embodiment 12, wherein the second calculator calculates a gain correction factor as a function of a detected sound signal synthesis amplitude value and a sound signal synthesis limiter threshold, and uses the gain correction factor to update the control gain.

Embodiment 14: The saturation detector according to embodiment 13, wherein the second calculator uses another, constant correction factor to update the control gain if the gain correction factor is lower than a certain threshold.

Embodiment 15: The saturation detector according to embodiment 14, wherein the second calculator performs no updating of the control gain if the gain correction factor is equal to or larger than the certain threshold.

Embodiment 16: A detector of saturation of an output sound signal synthesis from a sound signal decoder, comprising at least one processor and a memory coupled to the processor and storing non-transitory instructions that when executed cause the processor to implement (a) a first calculator of a saturation detection flag indicative of detection of saturation of the output sound signal synthesis, and (b) a second calculator responsive to the saturation detection flag for deciding if additional attenuation is to be applied to the output sound signal synthesis and determining an extent of the attenuation to be applied to the output sound signal synthesis.

Embodiment 17: A detector of saturation of an output sound signal synthesis from a sound signal decoder, comprising at least one processor and a memory coupled to the processor and storing non-transitory instructions that when executed cause the processor to (a) calculate a saturation detection flag indicative of detection of saturation of the output sound signal synthesis, and (b) in response to the saturation detection flag, decide if attenuation is to be applied to the output sound signal synthesis and determine an extent of the attenuation to be applied to the output sound signal synthesis.

Embodiment 18: A method for detecting saturation of an output sound signal synthesis from a sound signal decoder, comprising (a) calculating a saturation detection flag indicative of detection of saturation of the output sound signal synthesis, and (b) in response to the saturation detection flag, deciding if additional attenuation is to be applied to the output sound signal synthesis and determining an extent of the attenuation to be applied to the output sound signal synthesis.

Embodiment 19: The saturation detecting method according to embodiment 18, wherein the output sound signal synthesis comprises a plurality of channels and wherein the saturation detecting method is applied to every channel of the output sound signal synthesis.

Embodiment 20: The saturation detecting method according to embodiment 18 or 19, wherein calculating the saturation detection flag comprises initializing the saturation detection flag at the beginning of output sound signal synthesis processing frames.

Embodiment 21: The saturation detecting method according to any one of the embodiments 18 to 20, wherein calculating the saturation detection flag comprises updating a saturation detection counter which stores a probability that saturation is present in a current output sound signal synthesis processing frame.

Embodiment 22: The saturation detecting method according to embodiment 21, wherein the sound signal decoder produces a parameter indicative of bit errors in a bitstream received by the sound signal decoder, and calculating the saturation detection flag comprises updating the saturation detection counter to a maximum value thereof and setting the saturation detection flag to a saturation indicating value when the produced parameter indicates bit errors in the bitstream.

Embodiment 23: The saturation detecting method according to embodiment 21 or 22, wherein calculating the saturation detection flag comprises setting the saturation detection flag to a saturation indicating value when a detected sound signal synthesis amplitude value is larger than a given threshold and the saturation detection counter is larger than 0.

Embodiment 24: The saturation detecting method according to any one of the embodiments 21 to 23, wherein, if a detected sound signal synthesis amplitude value is larger than a given threshold, calculating the saturation detection flag comprises setting the saturation detection flag to a saturation indicating value and updating the saturation detection counter to the minimum between a maximum value of the saturation detection counter and the sum of the saturation detection counter and a constant.

Embodiment 25: The saturation detecting method according to embodiment 21, wherein calculating the saturation detection flag comprises setting the saturation detection flag to a saturation indicating value if (a) a parameter produced by the sound signal decoder indicates bit errors in a bitstream received by the sound signal decoder, (b) a detected sound signal synthesis amplitude value is larger than a first given threshold and the saturation detection counter is larger than 0, or (c) the detected amplitude value is larger than a second given threshold.

Embodiment 26: The saturation detecting method according to embodiment 25, wherein the first and second thresholds are related to a sound signal synthesis limiter threshold.

Embodiment 27: The saturation detecting method according to embodiment 21, wherein calculating the saturation detection flag comprises updating the saturation detection counter to the maximum between 0 and a difference between the saturation detection counter and a constant if (a) a parameter produced by the sound signal decoder indicates no bit errors in a bitstream received by the sound signal decoder, (b) a detected sound signal synthesis amplitude value is equal to or lower that a first given threshold and/or the saturation detection counter is equal to 0, and (c) the detected amplitude value is equal to or lower than a second given threshold.

Embodiment 28: The saturation detecting method according to any one of the embodiments 18 to 27, wherein deciding if additional attenuation is to be applied to the output sound signal synthesis and determining an extent of the attenuation to be applied to of the output sound signal synthesis comprises updating, in response to the saturation detection flag, a control gain for application to the sound signal synthesis.

Embodiment 29: The saturation detecting method according to embodiment 28, wherein updating of the control gain is made in response to the saturation detection flag equal to a saturation indicating value.

Embodiment 30: The saturation detecting method according to embodiment 29, wherein updating the control gain comprises calculating a gain correction factor as a function of a detected sound signal synthesis amplitude value and a sound signal synthesis limiter threshold, and using the gain correction factor to update the control gain.

Embodiment 31: The saturation detecting method according to embodiment 30, wherein updating the control gain comprises using another, constant correction factor to update the control gain if the gain correction factor is lower than a certain threshold.

Embodiment 32: The saturation detecting method according to embodiment 31, comprising performing no updating of the control gain if the gain correction factor is equal to or larger than the certain threshold.

Embodiment 33: A detector of saturation of a sound signal, comprising (a) a first calculator of a saturation detection flag indicative of detection of saturation of the sound signal, and (b) a second calculator responsive to the saturation detection flag for deciding if additional attenuation is to be applied to the sound signal and determining an extent of the attenuation to be applied to the sound signal.

Embodiment 34: The saturation detector according to embodiment 33, wherein the sound signal comprises a plurality of channels and wherein the saturation detector is applied to every channel of the sound signal.

Embodiment 35: The saturation detector according to embodiment 33 or 34, wherein the first calculator initializes the saturation detection flag at the beginning of sound signal processing frames.

Embodiment 36: The saturation detector according to any one of the embodiments 33 to 35, wherein the first calculator updates a saturation detection counter which stores a probability that saturation is present in a current sound signal processing frame.

Embodiment 37: The saturation detector according to embodiment 36, wherein a sound signal decoder produces a parameter indicative of bit errors in a bitstream received by the sound signal decoder, and the first calculator updates the saturation detection counter to a maximum value thereof and sets the saturation detection flag to a saturation indicating value when the produced parameter indicates bit errors in the bitstream.

Embodiment 38: The saturation detector according to embodiment 36 or 37, wherein the first calculator sets the saturation detection flag to a saturation indicating value when a detected sound signal amplitude value is larger than a given threshold and the saturation detection counter is larger than 0.

Embodiment 39: The saturation detector according to any one of the embodiments 36 to 38, wherein, if a detected sound signal amplitude value is larger than a given threshold, the first calculator sets the saturation detection flag to a saturation indicating value and updates the saturation detection counter to the minimum between a maximum value of the saturation detection counter and the sum of the saturation detection counter and a constant.

Embodiment 40: The saturation detector according to embodiment 36, wherein the first calculator sets the saturation detection flag to a saturation indicating value if (a) a parameter produced by a sound signal decoder indicates bit errors in a bitstream received by the sound signal decoder, (b) a detected sound signal amplitude value is larger than a first given threshold and the saturation detection counter is larger than 0, or (c) the detected amplitude value is larger than a second given threshold.

Embodiment 41: The saturation detector according to embodiment 40, wherein the first and second thresholds are related to a sound signal limiter threshold.

Embodiment 42: The saturation detector according to embodiment 36, wherein the first calculator updates the saturation detection counter to the maximum between 0 and a difference between the saturation detection counter and a constant if (a) a parameter produced by a sound signal decoder indicates no bit errors in a bitstream received by the sound signal decoder, (b) a detected sound signal amplitude value is equal to or lower that a first given threshold and/or the saturation detection counter is equal to 0, and (c) the detected amplitude value is equal to or lower than a second given threshold.

Embodiment 43: The saturation detector according to any one of the embodiments 33 to 42, wherein the second calculator is responsive to the saturation detection flag for updating a control gain for application to the sound signal.

Embodiment 44: The saturation detector according to embodiment 43, wherein the second calculator updates the control gain in response to the saturation detection flag equal to a saturation indicating value.

Embodiment 45: The saturation detector according to embodiment 44, wherein the second calculator calculates a gain correction factor as a function of a detected sound signal amplitude value and a sound signal limiter threshold, and uses the gain correction factor to update the control gain.

Embodiment 46: The saturation detector according to embodiment 45, wherein the second calculator uses another, constant correction factor to update the control gain if the gain correction factor is lower than a certain threshold.

Embodiment 47: The saturation detector according to embodiment 46, wherein the second calculator performs no updating of the control gain if the gain correction factor is equal to or larger than the certain threshold.

Embodiment 48: A detector of saturation of a sound signal, comprising at least one processor and a memory coupled to the processor and storing non-transitory instructions that when executed cause the processor to implement (a) a first calculator of a saturation detection flag indicative of detection of saturation of the sound signal, and (b) a second calculator responsive to the saturation detection flag for deciding if additional attenuation is to be applied to the sound signal and determining an extent of the attenuation to be applied to the sound signal.

Embodiment 49: A detector of saturation of a sound signal, comprising at least one processor and a memory coupled to the processor and storing non-transitory instructions that when executed cause the processor to (a) calculate a saturation detection flag indicative of detection of saturation of the sound signal, and (b) in response to the saturation detection flag, decide if attenuation is to be applied to the sound signal and determine an extent of the attenuation to be applied to the sound signal.

Embodiment 50: A method for detecting saturation of a sound signal, comprising (a) calculating a saturation detection flag indicative of detection of saturation of the sound signal, and (b) in response to the saturation detection flag, deciding if additional attenuation is to be applied to the sound signal and determining an extent of the attenuation to be applied to the sound signal.

Embodiment 51: The saturation detecting method according to embodiment 50, wherein the sound signal comprises a plurality of channels and wherein the saturation detecting method is applied to every channel of the sound signal.

Embodiment 52: The saturation detecting method according to embodiment 50 or 51, wherein calculating the saturation detection flag comprises initializing the saturation detection flag at the beginning of sound signal processing frames.

Embodiment 53: The saturation detecting method according to any one of the embodiments 50 to 52, wherein calculating the saturation detection flag comprises updating a saturation detection counter which stores a probability that saturation is present in a current sound signal processing frame.

Embodiment 54: The saturation detecting method according to embodiment 53, wherein a sound signal decoder produces a parameter indicative of bit errors in a bitstream received by the sound signal decoder, and calculating the saturation detection flag comprises updating the saturation detection counter to a maximum value thereof and setting the saturation detection flag to a saturation indicating value when the produced parameter indicates bit errors in the bitstream.

Embodiment 55: The saturation detecting method according to embodiment 53 or 54, wherein calculating the saturation detection flag comprises setting the saturation detection flag to a saturation indicating value when a detected sound signal amplitude value is larger than a given threshold and the saturation detection counter is larger than 0.

Embodiment 56: The saturation detecting method according to any one of the embodiments 53 to 55, wherein, if a detected sound signal amplitude value is larger than a given threshold, calculating the saturation detection flag comprises setting the saturation detection flag to a saturation indicating value and updating the saturation detection counter to the minimum between a maximum value of the saturation detection counter and the sum of the saturation detection counter and a constant.

Embodiment 57: The saturation detecting method according to embodiment 53, wherein calculating the saturation detection flag comprises setting the saturation detection flag to a saturation indicating value if (a) a parameter produced by a sound signal decoder indicates bit errors in a bitstream received by the sound signal decoder, (b) a detected sound signal amplitude value is larger than a first given threshold and the saturation detection counter is larger than 0, or (c) the detected amplitude value is larger than a second given threshold.

Embodiment 58: The saturation detecting method according to embodiment 57, wherein the first and second thresholds are related to a sound signal limiter threshold.

Embodiment 59: The saturation detecting method according to embodiment 53, wherein calculating the saturation detection flag comprises updating the saturation detection counter to the maximum between 0 and a difference between the saturation detection counter and a constant if (a) a parameter produced by a sound signal decoder indicates no bit errors in a bitstream received by the sound signal decoder, (b) a detected sound signal amplitude value is equal to or lower that a first given threshold and/or the saturation detection counter is equal to 0, and (c) the detected amplitude value is equal to or lower than a second given threshold.

Embodiment 60: The saturation detecting method according to any one of the embodiments 50 to 59, wherein deciding if additional attenuation is to be applied to the sound signal and determining an extent of the attenuation to be applied to of the sound signal comprises updating, in response to the saturation detection flag, a control gain for application to the sound signal.

Embodiment 61: The saturation detecting method according to embodiment 60, wherein updating of the control gain is made in response to the saturation detection flag equal to a saturation indicating value.

Embodiment 62: The saturation detecting method according to embodiment 61, wherein updating the control gain comprises calculating a gain correction factor as a function of a detected sound signal amplitude value and a sound signal limiter threshold, and using the gain correction factor to update the control gain.

Embodiment 63: The saturation detecting method according to embodiment 62, wherein updating the control gain comprises using another, constant correction factor to update the control gain if the gain correction factor is lower than a certain threshold.

Embodiment 64: The saturation detecting method according to embodiment 63, comprising performing no updating of the control gain if the gain correction factor is equal to or larger than the certain threshold.

What is claimed is:

1. A two-stage distortion limiter for limiting distortion in a sound signal, comprising:

at least one processor; and a memory coupled to the processor and storing non-transitory instructions that when executed cause the processor to implement:

a first stage comprising:

a level detector for detecting an amplitude value of the sound signal and for computing a control gain using the detected amplitude value;

an attenuator of the level of the sound signal using the control gain; and a second stage comprising:

a saturation detector for detecting saturation in the sound signal and for updating the control gain in response to detection of saturation.

2. The two-stage distortion limiter according to claim 1, wherein the detected amplitude value of the sound signal is a peak value of the sound signal.

3. The two-stage distortion limiter according to claim 1, wherein the sound signal comprises a plurality of channels and wherein the two-stage distortion limiter is a two-stage multi-channel distortion limiter of which the first and second stages are applied to every channel of the sound signal.

4. The two-stage distortion limiter according to claim 1, wherein the level detector compares the detected amplitude value with a sound signal limiter threshold to compute the control gain.

5. The two-stage distortion limiter according to claim 4, wherein, if the detected amplitude value is equal to or lower than the limiter threshold, the level detector sets the control gain to 1.

6. The two-stage distortion limiter according to claim 4, wherein, if the detected amplitude value is larger than the limiter threshold, the level detector selects the control gain as the larger of (a) a ratio between the detected amplitude value and the limiter threshold and (b) a lowest gain limit.

7. The two-stage distortion limiter according to claim 1, wherein the first stage comprises a calculator of an attack/release time parameter defining a shorter or longer attack/release time depending on transient versus non-transient characteristics of the sound signal.

8. The two-stage distortion limiter according to claim 7, wherein the sound signal is formed of sound signal samples, and wherein the attenuator comprises:

a gain filter using the attack/release time parameter and the control gain to obtain a gain per sample of the sound signal; and an amplifier for applying the gain per sample to the respective samples of the sound signal and obtain a distortion-limited sound signal.

9. The two-stage distortion limiter according to claim 1, wherein the saturation detector comprises a first calculator of a saturation detection flag indicative of detection of saturation of the sound signal.

10. The two-stage distortion limiter according to claim 9, wherein the first calculator updates a saturation detection counter which stores a probability that saturation is present in a current sound signal processing frame.

11. The two-stage distortion limiter according to claim 10, wherein a sound signal decoder produces a parameter indicative of bit errors in a bitstream received by the sound signal decoder, and the first calculator updates the saturation detection counter to a maximum value thereof and sets the saturation detection flag to a saturation indicating value when the produced parameter indicates bit errors in the bitstream.

12. The two-stage distortion limiter according to claim 10, wherein the first calculator sets the saturation detection flag to a saturation indicating value when (a) a parameter produced by a sound signal decoder indicates no bit errors in a bitstream received by the sound signal decoder, and (b) the detected amplitude value is larger than a given threshold and the saturation detection counter is larger than 0.

13. The two-stage distortion limiter according to claim 10, wherein, if (a) a parameter produced by a sound signal decoder indicates no bit errors in a bitstream received by the sound signal decoder, (b) the detected amplitude value is not larger than a first given threshold and/or the saturation detection counter is not larger than 0, and (c) the detected amplitude value is larger than a second given threshold, the first calculator sets the saturation detection flag to a saturation indicating value and updates the saturation detection counter to the minimum between a maximum value of the saturation detection counter and the sum of the saturation detection counter and a constant.

14. The two-stage distortion limiter according to claim 10, wherein the first calculator sets the saturation detection flag to a saturation indicating value if (a) a parameter produced by a sound signal decoder indicates bit errors in a bitstream received by the sound signal decoder, (b) the detected amplitude value is larger than a first given threshold and the saturation detection counter is larger than 0, or (c) the detected amplitude value is larger than a second given threshold.

15. The two-stage distortion limiter according to claim 10, wherein the first calculator updates the saturation detection counter to the maximum between 0 and a difference between the saturation detection counter and a constant if (a) a parameter produced by a sound signal decoder indicates no bit errors in a bitstream received by the sound signal decoder, (b) the detected amplitude value is equal to or lower than a first given threshold and/or the saturation detection counter is equal to 0, and (c) the detected amplitude value is equal to or lower than a second given threshold.

16. The two-stage distortion limiter according to claim 9, wherein the saturation detector comprises a second calculator responsive to the saturation detection flag equal to a saturation indicating value for updating the control gain.

17. The two-stage distortion limiter according to claim 16, wherein the second calculator calculates a gain correction factor as a function of the detected amplitude value and a sound signal limiter threshold, and uses the gain correction factor to update the control gain.

18. The two-stage distortion limiter according to claim 17, wherein the second calculator uses another, constant correction factor to update the control gain if the gain correction factor is lower than a certain threshold and performs no updating of the control gain if the gain correction factor is equal to or larger than the certain threshold.

19. The two-stage distortion limiter according to claim 1, wherein the sound signal is an output sound signal synthesis from a sound signal decoder.

20. A two-stage method for limiting distortion in a sound signal, comprising:

in a first stage:

detecting an amplitude value of the sound signal and computing a control gain using the detected amplitude value;

attenuating the level of the sound signal using the control gain; and in a second stage:

detecting saturation in the sound signal and updating the control gain in response to detection of saturation.

21. The two-stage distortion limiting method according to claim 20, wherein the detected amplitude value of the sound signal is a peak value of the sound signal.

22. The two-stage distortion limiting method according to claim 20, wherein the sound signal comprises a plurality of channels and wherein the two-stage distortion limiting method is a two-stage multi-channel distortion limiting method of which the first and second stages are applied to every channel of the sound signal.

23. The two-stage distortion limiting method according to claim 20, wherein detecting the sound signal amplitude value and computing the control gain comprises comparing the detected amplitude value with a sound signal limiter threshold to compute the control gain.

24. The two-stage distortion limiting method according to claim 23, wherein, if the detected amplitude value is equal to or lower than the limiter threshold, detecting the sound signal amplitude value and computing the control gain comprises setting the control gain to 1.

25. The two-stage distortion limiting method according to claim 23, wherein, if the detected amplitude value is larger than the limiter threshold, detecting the sound signal amplitude value and computing the control gain comprises selecting the control gain as the larger of (a) a ratio between the detected amplitude value and the limiter threshold and (b) a lowest gain limit.

26. The two-stage distortion limiting method according to claim 20, comprising, in the first stage, calculating an attack/release time parameter defining a shorter or longer attack/release time depending on transient versus non-transient characteristics of the sound signal.

27. The two-stage distortion limiting method according to claim 26, wherein the sound signal is formed of sound signal samples, and wherein attenuating the level of the sound signal comprises:

gain filtering, using the attack/release time parameter and the control gain, to obtain a gain per sample of the sound signal; and applying the gain per sample to the respective samples of the sound signal and obtain a distortion-limited sound signal.

28. The two-stage distortion limiting method according to claim 20, wherein detecting saturation in the sound signal and updating the control gain comprises calculating a saturation detection flag indicative of detection of saturation of the sound signal.

29. The two-stage distortion limiting method according to claim 28, wherein calculating the saturation detection flag comprises updating a saturation detection counter which stores a probability that saturation is present in a current sound signal processing frame.

30. The two-stage distortion limiting method according to claim 29, wherein a sound signal decoder produces a parameter indicative of bit errors in a bitstream received by the sound signal decoder, and wherein calculating the saturation detection flag comprises updating the saturation detection counter to a maximum value thereof and setting the saturation detection flag to a saturation indicating value when the produced parameter indicates bit errors in the bitstream.

31. The two-stage distortion limiting method according to claim 29, wherein calculating the saturation detection flag comprises setting the saturation detection flag to a saturation indicating value when (a) a parameter produced by a sound signal decoder indicates no bit errors in a bitstream received by the sound signal decoder, and (b) the detected amplitude value is larger than a given threshold and the saturation detection counter is larger than 0.

32. The two-stage distortion limiting method according to claim 29, wherein, if (a) a parameter produced by a sound signal decoder indicates no bit errors in a bitstream received by the sound signal decoder, (b) the detected amplitude value is not larger than a first given threshold and/or the saturation detection counter is not larger than 0, and (c) the detected amplitude value is larger than a second given threshold, calculating the saturation detection flag comprises setting the saturation detection flag to a saturation indicating value and updating the saturation detection counter to the minimum between a maximum value of the saturation detection counter and the sum of the saturation detection counter and a constant.

33. The two-stage distortion limiting method according to claim 29, wherein calculating the saturation detection flag comprises setting the saturation detection flag to a saturation indicating value if (a) a parameter produced by a sound signal decoder indicates bit errors in a bitstream received by the sound signal decoder, (b) the detected amplitude value is larger than a first given threshold and the saturation detection counter is larger than 0, or (c) the detected amplitude value is larger than a second given threshold.

34. The two-stage distortion limiting method according to claim 29, wherein calculating the saturation detection flag comprises updating the saturation detection counter to the maximum between 0 and a difference between the saturation detection counter and a constant if (a) a parameter produced by a sound signal decoder indicates no bit errors in a bitstream received by the sound signal decoder, (b) the detected amplitude value is equal to or lower than a first given threshold and/or the saturation detection counter is equal to 0, and (c) the detected amplitude value is equal to or lower than a second given threshold.

35. The two-stage distortion limiting method according to claim 28, wherein detecting saturation in the sound signal and updating the control gain comprises updating the control gain in response to the saturation detection flag equal to a saturation indicating value.

36. The two-stage distortion limiting method according to claim 35, wherein updating the control gain comprises calculating a gain correction factor as a function of the detected amplitude value and a sound signal limiter threshold, and using the gain correction factor to update the control gain.

37. The two-stage distortion limiting method according to claim 36, wherein updating the control gain comprises using another, constant correction factor to update the control gain if the gain correction factor is lower than a certain threshold and wherein no updating of the control gain is performed if the gain correction factor is equal to or larger than the certain threshold.

38. The two-stage distortion limiting method according to claim 20, wherein the sound signal is an output sound signal synthesis from a sound signal decoder.

39. A two-stage distortion limiter for limiting distortion in a sound signal, comprising:

a first stage comprising:

a level detector for detecting an amplitude value of the sound signal and for computing a control gain using the detected amplitude value;

an attenuator of the level of the sound signal using the control gain; and a second stage comprising:

a saturation detector for detecting saturation in the sound signal and for updating the control gain in response to detection of saturation.

40. A two-stage distortion limiter for limiting distortion in a sound signal, comprising:

at least one processor; and a memory coupled to the processor and storing non-transitory instructions that when executed cause the processor to:

in a first stage:

detect an amplitude value of the sound signal and compute a control gain using the detected amplitude value;

attenuate the level of the sound signal using the control gain; and in a second stage:

detect saturation in the sound signal and update the control gain in response to detection of saturation.

* * * * *